United States Patent
Henrici et al.

(10) Patent No.: US 9,958,506 B2
(45) Date of Patent: May 1, 2018

(54) METHOD FOR MONITORING A BATTERY

(71) Applicant: ROBERT BOSCH GMBH, Stuttgart (DE)

(72) Inventors: Fabian Henrici, Stuttgart (DE); Siegbert Steinlechner, Leonberg (DE)

(73) Assignee: Robert Bosch GmbH, Stuttgart (DE)

( * ) Notice: Subject to any disclaimer, the term of this patent is extended or adjusted under 35 U.S.C. 154(b) by 815 days.

(21) Appl. No.: 14/378,555

(22) PCT Filed: Jan. 10, 2013

(86) PCT No.: PCT/EP2013/050363
§ 371 (c)(1),
(2) Date: Aug. 13, 2014

(87) PCT Pub. No.: WO2013/120637
PCT Pub. Date: Aug. 22, 2013

(65) Prior Publication Data
US 2015/0025824 A1 Jan. 22, 2015

(30) Foreign Application Priority Data
Feb. 13, 2012 (DE) .................. 10 2012 202 079

(51) Int. Cl.
G01R 31/36 (2006.01)
H01M 10/42 (2006.01)
H01M 10/48 (2006.01)
H04Q 9/00 (2006.01)

(52) U.S. Cl.
CPC ...... *G01R 31/3648* (2013.01); *H01M 10/425* (2013.01); *H01M 10/4257* (2013.01); *H01M 10/482* (2013.01); *H04Q 9/00* (2013.01); *H01M 2010/4278* (2013.01); *H04Q 2209/10* (2013.01);
(Continued)

(58) Field of Classification Search
CPC .......... G01R 31/3658; G01R 19/16542; G01R 31/3662; G01R 31/3679; G01R 31/3693; G01R 31/3689; G01R 31/3696; H01M 10/482; H01M 2010/4271; H01M 2220/20; H01M 10/44; H01M 10/441; H01M 10/42; H01M 10/04
See application file for complete search history.

(56) References Cited

U.S. PATENT DOCUMENTS 5,652,498 A * 7/1997 Edye .................. G01R 31/3648
320/DIG. 21
2002/0163339 A1 11/2002 Friel et al.
(Continued)

FOREIGN PATENT DOCUMENTS

JP 2000173674 A 6/2000
JP 2002521792 A 7/2002
(Continued)

*Primary Examiner* — Kyle R Quigley
(74) *Attorney, Agent, or Firm* — Norton Rose Fulbright US LLP; Gerard Messina

(57) ABSTRACT

A method is described for monitoring a battery, and a battery and a system for carrying out the method in connection with such a battery. A number of sensors are assigned to the battery, the sensors being connected serially to one another and to a control unit via a data line; at least one of the sensors putting in each case at least one data word on the data line.

12 Claims, 2 Drawing Sheets

(52) U.S. Cl.
CPC ..... *H04Q 2209/30* (2013.01); *H04Q 2209/82* (2013.01)

(56) References Cited

U.S. PATENT DOCUMENTS

| | | | |
|---|---|---|---|
| 2008/0180106 A1* | 7/2008 | Gorbold | G01R 31/3658 324/434 |
| 2009/0265121 A1 | 10/2009 | Rocci et al. | |
| 2011/0068746 A1 | 3/2011 | Rocci et al. | |

FOREIGN PATENT DOCUMENTS

| | | |
|---|---|---|
| JP | 2010205557 A | 9/2010 |
| WO | 2009/149690 | 12/2009 |

\* cited by examiner

METHOD FOR MONITORING A BATTERY

FIELD OF THE INVENTION

The present invention relates to a method for monitoring a battery, a battery that is developed to carry out the method and a system that is used in such a battery for carrying out the method provided.

BACKGROUND INFORMATION

A battery is an interconnection of a plurality of galvanic cells, of the same type, as a rule, and it represents an electrochemical energy store and an energy converter, which is provided to output electrical energy. In the battery, during discharge, stored chemical energy is converted to electrical energy by the electrochemical reaction, for this purpose. In this process, the cells of the battery, which may be connected in parallel or in series or in a mixed fashion, are situated in so-called modules. One or more of these modules, connected in series or in parallel, form the battery.

As to the cells mentioned, one may distinguish between primary cells, that are not rechargeable, and secondary cells, that are rechargeable. A rechargeable battery is also designated as an accumulator having accumulator cells. In the following, the term battery is intended to include both a non-rechargeable battery, as well as a rechargeable battery.

Batteries are used, for example, in motor vehicles for providing the electric current for the starter of the internal combustion engine. Such a battery is designated as a starter battery and is developed as a lead accumulator, for instance. Besides supplying the starter, the battery also supplies the other electrical users in the vehicle. For starting the internal combustion engine, high currents are briefly required which also have to be provided at low temperatures. In electric vehicles or hybrid vehicles, batteries are also used as energy sources for driving the vehicle. These are also designated as traction batteries.

In each case it is required that the functional capability of the battery in the vehicle be monitored regularly or even continually, in order to ensure a reliable operation of the motor vehicle. For this purpose, characteristic variables and operating variables of the battery are picked up, such as the terminal voltage, the temperature, the pressure, particularly the internal pressure of the cell, the current, the impedance, etc.

It is believed to be understood that one may use sensors in the battery for monitoring and communication. Furthermore, it is believed to be understood that, inside the battery, one may record sensor signals via data lines provided for this, such as the CAN bus, which is used typically in motor vehicles.

Document WO 2009/149690 A1 discusses a battery having battery cells and a method for monitoring the battery. The battery presented there has a plurality of battery cell stacks, a battery cell stack being able to have a single battery cell or to be constructed of battery cells connected in parallel. Sensors monitor the charge state of individual battery cells. A charge compensation device is assigned to the described battery, which has a target value table of the admissible charge states of individual batteries. The charge compensation device varies the charge compensation as a function of the charge state.

When the target value for the charge state of individual battery cells is reached, the charge compensation of the battery cells is interrupted. On each battery cell, a tapping is situated for a charge compensation line, the charge compensation arrangements being unified in a wiring harness and being supplied to provided cell monitoring modules which, on their part, have sensors and cell monitoring circuits, these components of the cell monitoring being situated in common in the charge compensation device, spatially separated from the battery cells.

SUMMARY OF THE INVENTION

With this as background, a method for monitoring a battery according to the description herein, a battery having the features according to the description herein and a system that will be used in such a battery according to the description herein are provided. Specific embodiments result from the dependent claims and the specification.

Using the method provided, a communication may be carried out between battery sensors on battery cells and to a central control unit.

Up to now, applying or inserting battery sensors in a sensor system on or in battery cells of hybrid vehicles and electric vehicles has been known. Typically, this applies to 100 or more cells of which each is able to be supplied with one battery sensor. Between these sensors and a central control unit, measured data and control commands have to be exchanged unidirectionally or bidirectionally.

Now described is the use of a serial communication between the individual sensors. In the embodiment, each sensor transmits its data or a data word to the next one, which joins in its data and passes on the total packet to the next sensor. The control unit is connected at the end of the chain and receives an overall data packet having the data of all the sensors. Thus, each sensor puts a data word assigned to it on the data line. All the data words, when joined together, form the overall data packet. In the other direction, a reverse channel may optionally be provided from the control unit to the first sensor in the chain. In that case, the data and/or the control signals also pass through the chain until they have been received by all the sensors. The sensors may be located outside or inside the cell. In the latter case, a duct is required for two additional wires. If a reverse channel is provided, the data words or the overall data packet are able to "run around in a circle" and may also be overwritten again by the respective sensors.

In the method presented, it is provided that at least one of the sensors each put at least one data word on the data line. In this context, the data words may be joined together to form one overall data packet, and the overall data packet may be sent to the control unit via the data line.

In one specific embodiment, a first data word is sent by a sensor via the data line to a next sensor, an additional data word is joined to the first data word by the next sensor, and this is carried on until one overall data packet, which includes data words of all the sensors reaches the control unit.

If it were known ahead of time how big the data packet is, that is to be received by the control unit, it may alternatively be provided that a first data word is put on the data line by a sensor, and this is transmitted to the control unit and, after a predetermined time period, a next sensor puts a second data word on the data line. In this case, the first sensor may send, for example, a "normal" RS232 data packet having an 8-bit content, for example, and then provide a pause, for instance 200*the time period required for transmission to the control unit. The next or second sensor then hangs its data word behind it, etc. The control unit then receives, for instance, one hundred 8-bit data packets, which it is able to receive, one after the other, using a usual RS232 receiver (UART)

The method presented has essential advantages, at least in some of the embodiments:

1. The method presented represents a cost-effective procedure, since only two connections are required per sensor and only one single wire connection between the sensors.

2. Each sensor sees only the voltage difference from its direct neighbor, that is, plus or minus 4 V, which is simple to implement, using standard CMOS technology, in contrast to the full overall voltage of all cells (−400 V), which would be present in an in-parallel connection.

3. The serial connection simplifies the identification of the individual cells, and it is simple to determine whether a battery sensor is located, for example, at the 35th position in the chain.

4. Only a single bit has to be transmitted to warn of undesired operating states, such as reaching the end-of-charge voltage. Each sensor transmits further the "OK" signal of its predecessor, or changes it to a "not OK" signal, if its own state is critical.

The method described may be used for all applications in which characteristic variables, such as the temperature, have to be measured during operation. The method is particularly suitable for use in batteries in motor vehicles, especially in electric vehicles.

Besides the temperature, the cell voltage, for example, may also be measured. The evaluation may then take place in the connected control unit. A further possible function that may be supported is the so-called cell balancing.

The sensors, which pick up the measured variables, may be in contact with assigned battery modules or battery cells, i.e. the sensors are situated on or in the modules or the cells. In this context, a sensor may be assigned to each module or even to each cell. The sensors may then give at least one measured variable and or information item, such as "OK" and "not OK" on the state of the associated module or the associated cell.

Additional advantages and developments of the present invention result from the specification and the appended figures.

It is understood that the features mentioned above and still to be explained below may be used not only in the indicated combination, but in other combinations as well, or by themselves, without departing from the scope of the present invention.

DETAILED DESCRIPTION

Figure 1:
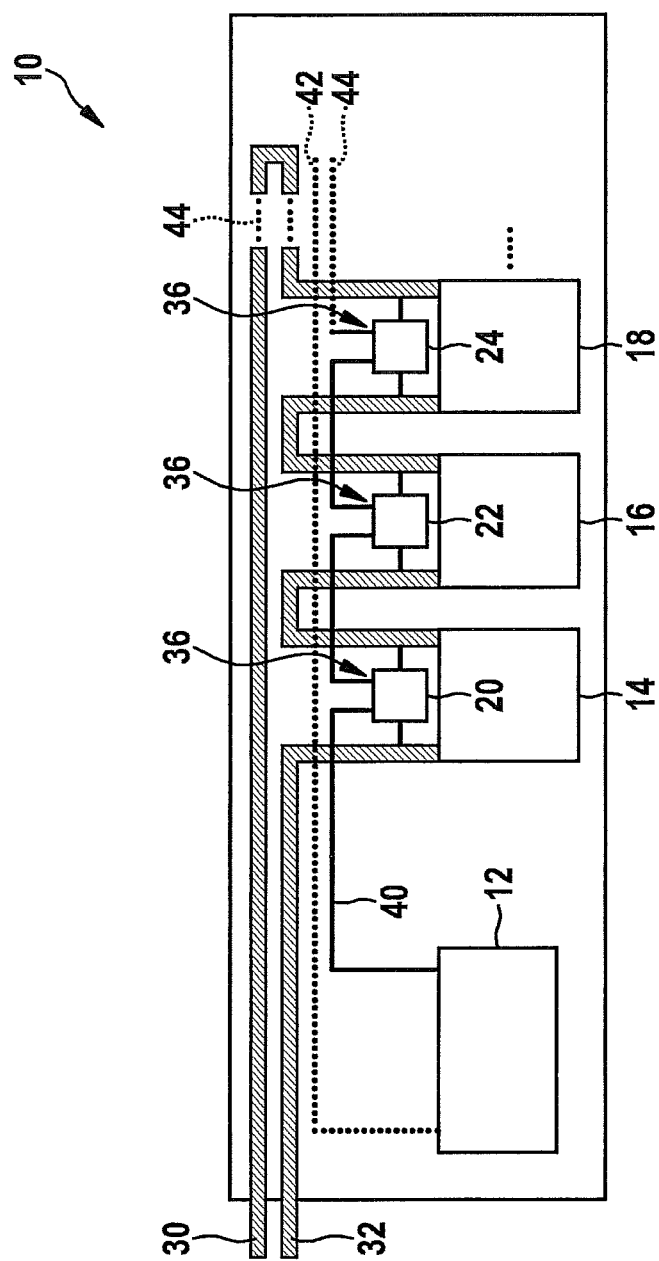
FIG. 1 shows an embodiment of the described battery in a schematic representation.

The present invention is represented schematically in the drawings with the aid of specific embodiments and is described in detail below with reference to the drawings.

FIG. 1 reproduces an embodiment of the battery presented, denoted overall by reference numeral 10. The illustration shows a control unit 12, a first cell 14, a second cell 16 and a third cell 18. For reasons of clarity, only three cells 14, 16 and 18 are shown in the illustration, but obviously more cells 14, 16 and 18 could also be provided which, in turn, could be grouped in modules. The individual cells, in turn, may include a number of galvanic cells.

A first sensor 20 is assigned to first cell 14, a second sensor 22 is assigned to second cell 16 and a third sensor 24 is assigned to third cell 18. In this embodiment, exactly one sensor 20, 22 and 24 respectively is assigned to each cell 14, 16 and 18. Other embodiments are also conceivable, however, in which sensors 20, 22, 24 are assigned to only some of cells 14, 16, 18, galvanic cells, modules and also only to some of the modules. Cells 14, 16, 18 are connected in series in this embodiment, and may, in turn, include an in-parallel connection and/or a series connection of galvanic cells.

Moreover, the illustration shows two conductor rails 30 and 32, via which cells 14, 16 and 18 are connected and via which sensors 20, 22 and 24 are also able to be supplied. Sensors 20, 22, 24 may also be supplied from the respective assigned cells 14, 16, 18 or supplied by a dedicated supply line. Furthermore, a serial data line 40 is shown, via which sensors 20, 22 and 24 are connected serially, or rather in order. At one end of the serial connection, control unit 12 is connected. Sensors 20, 22 and 24 are connected to serial data line 40 via serial sensor interfaces 36. For further clarification, the illustration also shows an optional reverse channel 42 and a connection 44 to the next cell, which is not shown in this illustration.

Serial data line 40, sensor interfaces 36, sensors 20, 22 and 24 and control unit 12 represent a system 50, which enables a serial communication between individual cells 14, 16 and 18. For this purpose, each sensor 20, 22 and 24 is able to transmit a data word to the next sensor 20, 22 and 24. The latter then joins its data word to the transmitted data packet and passes it on to the next sensor 20, 22 and 24. Control unit 12 at the end of the chain obtains information items on all sensors 20, 22 and 24 and cells 14, 16 and 18. The optionally provided reverse channel 42, from control unit 12 to first sensor 20 and onwards from it, may be used to send data, such as control signals or configuration data files, to sensors 20, 22 and 24.

Figure 2:
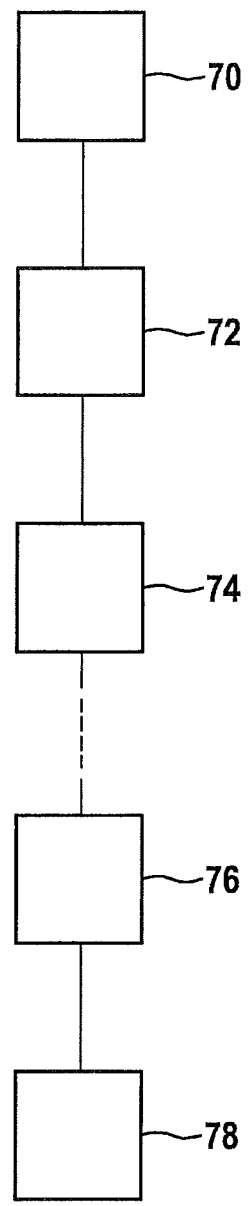
FIG. 2 shows a specific embodiment of the method described in a flow chart.

In a flow chart in FIG. 2, a possible embodiment of the method is provided, which basically enables a communication between sensors in a battery and between parts such as cells or modules of the battery, and may therefore be used for monitoring this battery.

In a first step 70, a first sensor puts a measured value, that was recorded by an associated cell, and information on the operating state and, perhaps, on the functional capability of this cell on a serial data line, via a serial sensor interface. This measured value, or a data word representing it, is sent to a further, serially situated sensor via the serial data line in a further step 72 which, in turn, in an additional step 74, joins a corresponding data word to the received data word.

This process is repeated until all the sensors, which are connected serially via the data line, have attached or included data to/in the data packet. Finally, the entire data packet, or the overall data packet is passed on to a control unit as the last component in the series, in a step 76, which evaluates the overall data packet in a final step 78 and, in the process, is able to accurately assign data included in the data packet to the sensors in series.

What is claimed is:

1. A method for monitoring a battery, the method comprising:

transmitting, by a first sensor of a plurality of serially connected sensors configured to monitor the battery, a first data word to at least one further sensor of the plurality of serially connected sensors via a forward channel on a first data line;

receiving, by the at least one further sensor, the first data word, forming by the at least one further sensor a data packet including the first data word and a further data word, and transmitting by the at least one further sensor the data packet to a control unit separate from the plurality of serially connected sensors; and receiving, by the first sensor from the control unit, the data packet including the first and further data words via a reverse channel on a second data line.

2. The method of claim 1, wherein the data words are linked together to form one overall data packet, and the overall data packet is sent to the control unit via the data line.

3. The method of claim 2, wherein a first data word is sent by a sensor via the data line to a next sensor, an additional data word is joined to the first data word by the next sensor, and this is carried on until one overall data packet, which includes data words of all the sensors, reaches the control unit.

4. The method of claim 1, wherein a first data word is put by a sensor on the data line and this is transmitted to the control unit, and after a predetermined time period, a next sensor puts a second data word on the data line.

5. The method of claim 1, wherein the control unit evaluates the overall data packet and in this context assigns individual data words to the respective sensors.

6. The method of claim 5, wherein an individual sensor is identified with respect to its mechanical location.

7. The method of claim 1, wherein the data words are able to get to the sensors again via the reverse channel and are able to be overwritten in each case by the associated sensor.

8. The method of claim 1, wherein a single bit is transmitted as the data word.

9. A battery, comprising:
a plurality of cells;
a plurality of sensors, which are serially connected to one another and to a control unit separate from the plurality of sensors via a forward data channel over a first data line, including a first sensor to transmit a first data word to at least one further sensor via the forward channel, and the at least one further sensor to form a data packet including the first data word and a further data word and transmit the data packet via the forward channel to the control unit; and
a reverse channel on a second data line to transmit the data packet including the first and further data words from the control unit to the first sensor.

10. The battery of claim 9, further comprising:
current rails to supply the sensors.

11. The battery of claim 9, wherein the supplying of the sensors takes place from a respective cell or from a dedicated supply line.

12. A system for monitoring a battery, comprising:
a plurality of sensors, which are serially connected to one another and to a control unit separate from the plurality of sensors via a forward data channel over a first data line, including a first sensor to transmit a first data word to at least one further sensor via the forward channel, and the at least one further sensor to form a data packet including the first data word and a further data word and transmit the data packet via the forward channel to the control unit; and
a reverse channel on a second data line to transmit the data packet including the first and further data words from the control unit to the first sensor.

* * * * *